United States Patent [19]
Kleinerman

[11] Patent Number: 5,431,742
[45] Date of Patent: Jul. 11, 1995

[54] LUMINESCENT SOLAR CONCENTRATORS USING LIGHT AMPLIFICATION PROCESSES

[76] Inventor: Marcos Y. Kleinerman, 24 Jerome St., Southbridge, Mass. 01550

[21] Appl. No.: 186,276

[22] Filed: Jan. 24, 1994

[51] Int. Cl.$^6$ .......................................... H01L 31/055
[52] U.S. Cl. .................................. 136/247; 136/206; 136/259; 126/680; 250/484.4; 250/486.1; 385/900
[58] Field of Search ....................... 136/206, 247, 259; 126/680; 250/484.4, 486.1; 385/900

[56] References Cited

U.S. PATENT DOCUMENTS

| | | | |
|---|---|---|---|
| 4,146,790 | 3/1979 | Goetzberger et al. | 250/336.1 |
| 4,292,959 | 10/1981 | Coburn, Jr. | 126/686 |
| 4,425,907 | 1/1984 | Younghouse | 126/685 |
| 4,488,047 | 12/1984 | Thomas | 250/486.1 |
| 4,799,748 | 1/1989 | Brown | 385/31 |
| 4,884,860 | 12/1989 | Brown | 385/27 |

Primary Examiner—Aaron Weisstuch

[57] ABSTRACT

The invention is drawn to a planar luminescent solar concentrator including an optical fiber comprised of laser material. Solar energy collected by the concentrator is processed into laser radiation emitted by the optical fiber with high energy density corresponding to a concentration factor much greater than possible with prior art luminescent solar concentrators.

7 Claims, 1 Drawing Sheet

LUMINESCENT SOLAR CONCENTRATORS USING LIGHT AMPLIFICATION PROCESSES

BACKGROUND OF THE INVENTION

The present invention relates to improved methods and devices for solar generation of electrical power, based on the use luminescent solar energy concentrators in conjunction with fiber optic lasers.

DESCRIPTION OF THE PRIOR ART

Despite optimistic projections made during the nineteen seventies and early eighties, the cost of efficient solar photovoltaic cells (PVCs) has not yet been reduced to the point where solar electrical power generation can compete economically with nuclear or fossil fuel power generation. In order to circumvent the high cost of efficient solar cells, reflecting curved mirrors have been used to concentrate the solar radiation and focus it onto the PVCs. But this technique works only with direct sunlight, and in most regions of the world most of the solar radiation is in the form of diffuse sunlight, which cannot be efficiently concentrated. And the focusing of sunlight concentrated by mirrors into the PVC requires the continuous steering of the mirror to follow the changing orientation of the illuminated region with respect to the sun rays caused by the earth's daily rotation.

Because of these shortcomings, Weber and Lambe (W. H. Weber and J. Lambe, *Appl. Opt.* 15, 2299 (1976) and others proposed the use of luminescent solar concentrators (LSCs), an attractive feature of which is that their performance does not depend on whether the solar radiation is direct or diffuse. A luminescent solar concentrator is illustrated in FIG. 1. It is typically an optically homogeneous plate 10 doped with photoluminescent ions or organic dyes, and uses the phenomenon of total internal reflection (TIR) at the faces of the plate exposed to the solar radiation to transmit to one or more edges E of the plate a relatively high fraction of the intensity of the luminescence light generated at the plate by the solar radiation. The edge(s) to which the luminescence light is transmitted are in optical communication with photo-voltaic cells (PVCs) PV for electrical power generation. The photon flux gain G at a plate edge in contact with a PVC is given by the relation $$G = (A_f/A_c) Q_a Q_c \phi (1 - n^{-2})^{0.5} \qquad (1)$$

where $A_f$ and $A_c$ are the areas of the face and of the collecting edge(s) of the LSC, respectively; $Q_a$ is the absorbed fraction of the intensity of the incident solar radiation of energy higher than the band gap of the active material of the PVC, $\phi$ is the luminescence quantum efficiency of the photoluminescent material, n is the index of refraction of the plate material, and $Q_c$ is the fraction of the luminescent photons trapped within the plate by TIR which reach the PVCs.

A serious shortcoming of the prior art luminescence concentration techniques is that, in order to achieve cost-effective optical flux concentration factors at the photovoltaic solar cells, one requires relatively long spatially-averaged optical paths from the points of generation of the luminescence to the solar cells, and essentially all the known luminescent materials, whether dye-doped plastics or inorganic glasses doped with photoluminescent metal ions, absorb a relatively large fraction of the intensity of their luminescence over these optical paths. The problem is serious even for efficient photoluminescent materials having a relatively large stokes shift between the lowest energy electronic absorption band and the photon energies of the main luminescence band. And the luminescence loss by reabsorption becomes more serious as the temperature of the luminescent plate increases under the action of the absorbed solar energy. This is due to the fact that a substantial fraction of the intensity of the luminescence is emitted at wavelengths at which the absorption of light by the luminescent material increases with increasing temperature.

OBJECTS OF THE INVENTION

The present invention relates to methods and devices for the concentration of solar radiation by means of photoluminescent materials and fiber optic lasers. It is an object of this invention to overcome the shortcoming of the prior art caused by the absorption of a relatively large fraction of the intensity of their luminescence emitted by the photoluminescent material of the concentration plate.

SUMMARY OF THE INVENTION

The objects of this invention are accomplished by the use of photoluminescent materials which are also efficient laser materials. When these materials are placed within an optical feedback cavity and solar-pumped to an extent sufficient to cause a population inversion of the excited molecules, the energy loss by reabsorption is greatly minimized because the spontaneous luminescence otherwise emitted over a 360° solid angle and including all the optical wavelengths within the luminescence band is suppressed in favor of a stimulated emission at preselected wavelengths not including the wavelengths which would otherwise be reabsorbed. Thus, the cavity can be made sufficiently long for obtaining the required solar concentration factor, without serious optical losses. This can be achieved by incorporating the laser material within a long optical fiber. Since an optical fiber does not present a sufficient surface area for receiving enough non-focused solar energy to be useful, it is necessary to provide some initial concentration step for the solar radiation in order to couple a useful amount of energy into the fiber. This initial concentration can be effected, for example, by means of a substantially rectangular photoluminescent plate having a relatively short dimension perpendicular to the fiber axis and a much longer dimension in the direction along the fiber length.

DEFINITIONS

Within the context of this application, I am using the following definitions:

Light optical radiation, whether or not visible to the human eye.

Occupancy number of an energy level the fraction of the total number of molecules of a probe material occupying said energy level.

Luminescence

Light emitted by a material upon absorption of light or other radiation of sufficient quantum energy. The term includes both fluorescence and phosphorescence.

Photoluminescence

Luminescence generated by the absorption of light.

Photoluminescent material

A material which emits luminescence generated by the absorption of light. Used without qualifications, the term does not refer to a laser material.

Luminescence centers

Atoms or molecules (including ions) of a photoluminescent material which absorb light and emit luminescence light.

Laser material

A photoluminescent material which generates laser light upon absorption of a sufficiently high intensity of light of wavelengths which can generate photoluminescence in the material. In this application it refers to the material comprising the core of the fiber laser.

Luminescence quantum efficiency also referred to as luminescence efficiency): the ratio of the number of luminescence photons emitted by a photoluminescent material to the number of photons of the excitation light absorbed by the material. All other terms have the customary meaning known to those of at least average competence in the art.

DETAILED DESCRIPTION OF THE INVENTION

Figure 1:
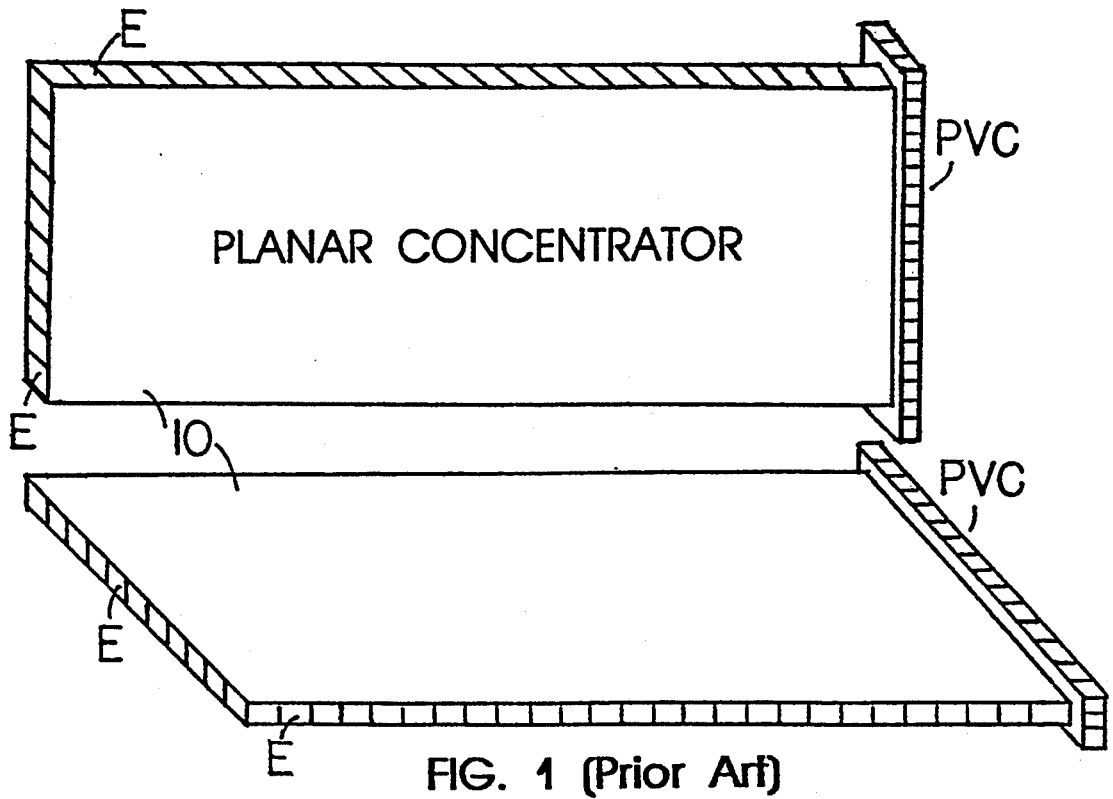
FIG. 1 illustrates a prior art luminescent solar concentrator.
Figure 2:
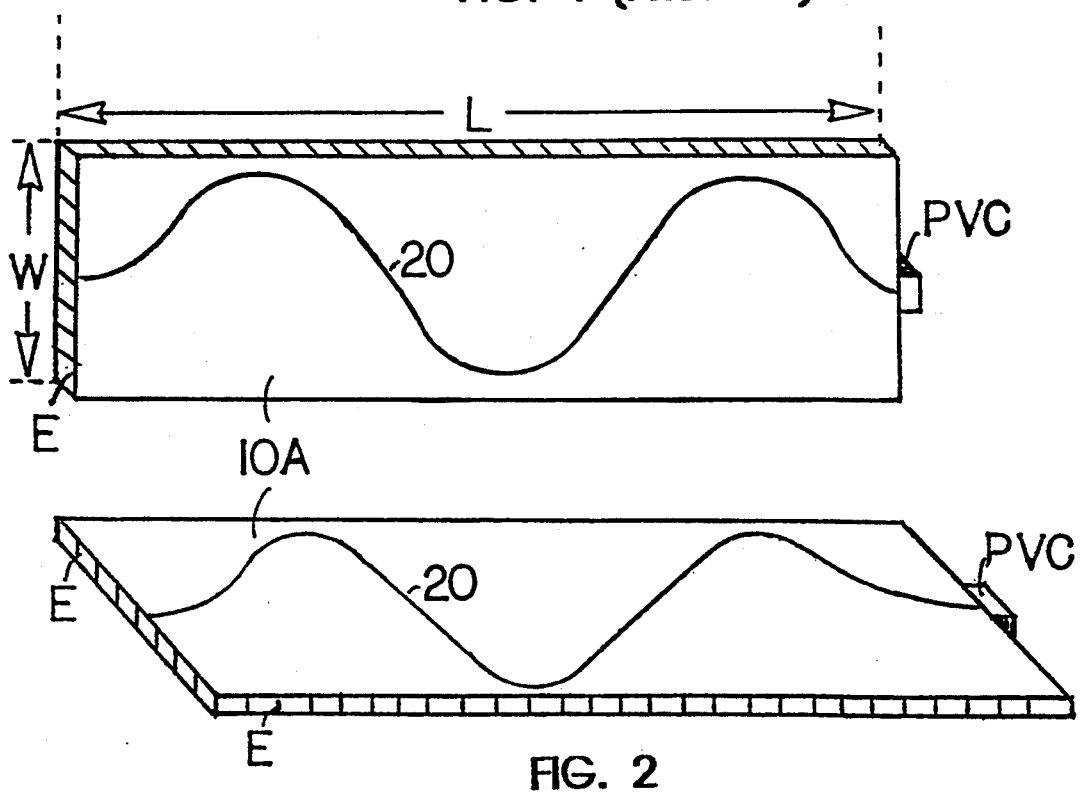
FIG. 2 shows the structure of a luminescent solar concentrator according to this invention.

A preferred embodiment of fiber optic laser solar concentrator according to the invention is represented in FIG. 2. It consists of a glass or plastic plate 10A doped with a material capable of absorbing a substantial fraction of the intensity of the solar radiation impinging on the plate and converting it with high quantum efficiency into luminescence radiation of wavelengths $\lambda_{fl}$ within an electronic absorption band of the laser material included in optical fiber 20. The laser material should preferably be a so-called "four level material" wherein the fourth level, that is the terminal level of the laser transition, is high enough above the ground level to have a negligible population at the temperature of operation of the concentrator. This is necessary in order to minimize the threshold pump power for laser action and the laser beam power loss by reabsorption.

A preferred laser material for fiber 20 is $Nd^{3+}$-doped glass, which has a relatively strong (for a glass) absorption band centered at about 810 nanometers (nm), and other strong bands at shorter wavelengths. The laser fiber is disposed within a clear photoluminescent planar structure as shown in FIG. 2. The plate 10A is comprised of a photoluminescent material capable of absorbing a relatively large fraction of solar radiation incident on the plate and converting it into luminescence light with a peak luminescence band overlapping an electronic absorption band of $Nd^{3+}$, preferably the $^4I_{9/2} \rightarrow {^4F_{5/2}}$ band. The main laser band of $Nd^{3+}$ peaks at a wavelength of about 1060 nm, depending on the nature of the glass. This corresponds to the electronic transition $^4F_{3/2} \rightarrow {^4I_{11/2}}$. The terminal level $^4I_{11/2}$ is about 1950 $cm^{-1}$ higher than the ground level, so the occupany number of the level is therefore less than $10^{-4}$ of that of the ground level, which ensures minimal optical power loss by reabsorption.

The width W of the concentrator plate is not much greater than 20 cm, small enough that the median path length of the luminescence light generated at the plate outside the fiber and directed to the fiber by multiple TIRs is smaller than that which cause excessive optical power loss by luminescence reabsorption. The laser fiber follows a meandering path along the concentrator plate in order to better capture the luminescence light rays emitted at small angles relative to the long axis of the plate. Because of this geometry the light rays of the luminescence generated outside of the optical fiber travel a relatively short path before they are absorbed by the laser material of the optical fiber. Under bright or moderately bright sunlight, the light intensity absorbed by the $Nd^{3+}$ ions is sufficiently intense to generate a population inversion of the $Nd^{3+}$ ions and stimulated light amplification of wavelengths near 1060 nm. Even diffuse sunlight can generate a population inversion of the $Nd^{3+}$ ions, as the concentrator plate can concentrate this diffuse sunlight as well as the direct sunlight.

The length L of the plate can be more than ten meters long without excessive reabsorption losses, because the length of the plate does not significantly affect the path length of the luminescence light rays generated outside of the optical fiber.

The solar photon flux gain G' at the photovoltaic cell in optical communication with one end of the laser fiber follows approximately the relation $$G' = (A_f/A'_c) Q_a \cdot Q'_c \phi (1-n^{-2})^{0.5} \qquad (2)$$

where $A'_c$ is the cross-sectional area of the laser fiber, and $Q'_c$ is the fraction of the luminescence photons trapped within the plate by TIR which are converted into $Nd^{3+}$ laser photons reaching the PVC.

Although planar structures are a preferred choice, it should be apparent to those of ordinary skill in the art that curved panels and other structures are within the scope of the invention.

One preferred kind of luminescent solar concentrator material is a transparent plastic like an acrylic, polyurethane, or polystyrene material doped with an organic fluorescent dye. There are numerous fluorescent dyes to chose from. Preferred dyes should be those possessing high photochemical stability, a fluorescence quantum efficiency not much lower than 0.5 (preferably higher than 0.75), and a fluorescence band with a peak near 805 nm, corresponding to a relatively strong absorption band of $Nd^{3+}$. An example is the laser dye HITC, available from Exciton, Inc. (Dayton, Ohio). A dye having a fluorescent band with a peak near 750 nm, within another absorption band of $Nd^{3+}$, is also suitable. An example is the laser dye LDS 759, also available from Exciton, Inc.

Another preferred kind of luminescent solar concentrator material is a transparent so-called "sol-gel" glass doped with an organic fluorescent dye. A sol-gel glass is a glass produced from an aqueous solution of a silicate salt by acid precipitation and subsequent dehydration.

Yet another preferred kind of luminescent solar concentrator material is a transparent low melting glass doped with an organic fluorescent dye.

Since certain changes may be made in the foregoing specification without departing from the scope of the invention herein disclosed, it is intended that all matter contained in the above description and/or depicted in the accompanying drawings be construed in an illustrative and not in a limiting sense.

We claim:

1. A luminescent solar concentrator comprising:
   (a) an optically homogeneous planar structure doped with photoluminescent material and including an optical fiber having two ends and a core comprised of laser material, the concentrator being so characterized that, when exposed to sunlight, it generates from said photoluminescent material luminescence light including wavelengths within at least one absorption band of said laser material, thereby generating optical radiation within at least one characteristic laser band for the laser material, at least a fraction of the intensity of said generated optical radiation being transmitted to at least one of said two ends of said fiber; and
   (b) energy conversion means in optical communication with said one end of said fiber for converting said optical radiation transmitted thereto to useful energy.

2. A luminescent solar concentrator as claimed in claim 1 wherein said energy conversion means includes a photovoltaic cell for converting said optical radiation to electrical energy.

3. A luminescent solar concentrator as claimed in claim 1 wherein said energy conversion means includes a light absorber for converting said optical radiation to thermal energy.

4. A luminescent solar concentrator as claimed in claim 3 wherein said thermal energy is converted to electrical energy.

5. A luminescent solar concentrator as claimed in claim 1 wherein said photoluminescent material is a carbon-based polymer doped with an organic fluorescent dye.

6. A luminescent solar concentrator as claimed in claim 1 wherein said photoluminescent material is a sol-gel glass doped with an organic fluorescent dye.

7. A luminescent solar concentrator as claimed in claim 1 wherein said laser material is a glass doped with trivalent neodymium ions.

* * * * *